United States Patent [19]

Dean et al.

[11] Patent Number: 4,473,455
[45] Date of Patent: Sep. 25, 1984

[54] WAFER HOLDING APPARATUS AND METHOD

[75] Inventors: Robert E. Dean, High Bridge; James L. Fink, Millburn, both of N.J.

[73] Assignee: AT&T Bell Laboratories, Murray Hill, N.J.

[21] Appl. No.: 473,261

[22] Filed: Mar. 14, 1983

Related U.S. Application Data

[63] Continuation of Ser. No. 332,932, Dec. 21, 1981, abandoned.

[51] Int. Cl.$^3$ .............................................. C23C 15/00
[52] U.S. Cl. .................................. 204/298; 156/345; 156/643; 204/192 E; 118/503; 118/723; 118/50.1; 269/903
[58] Field of Search .......................... 204/192 E, 298; 118/500, 503, 731, 730, 728, 729, 620, 723, 50.1; 156/345, 643; 269/903, 287, 254 R, 237; 427/12

[56] References Cited

U.S. PATENT DOCUMENTS

| | | | |
|---|---|---|---|
| 3,977,955 | 8/1976 | Nevis et al. | 204/192 E |
| 3,983,838 | 10/1976 | Christensen | 118/500 X |
| 4,298,443 | 11/1981 | Maydan | 156/643 X |
| 4,306,731 | 12/1981 | Shaw | 279/4 |
| 4,341,616 | 7/1982 | Nagatomo et al. | 204/192 E |
| 4,367,114 | 1/1983 | Steinberg et al. | 204/298 X |
| 4,376,692 | 3/1983 | Tsukada et al. | 204/298 |
| 4,392,938 | 7/1983 | Harra et al. | 204/298 |

OTHER PUBLICATIONS

Clark et al., "Wafer Holder", IBM Technical Disclosure Bulletin, vol. 19, No. 10, Mar. 1977, pp. 3734-3735.
Horton et al., "Planetary Rotating Etching Wheel", IBM Technical Disclosure Bulletin, vol. 21, No. 6, Nov. 1978, pp. 2419-2420.

Primary Examiner—John D. Smith
Assistant Examiner—Bernard F. Plantz
Attorney, Agent, or Firm—Lucian C. Canepa

[57] ABSTRACT

At least three spring-mounted members disposed around the periphery of an aperture in a wafer-mounting plate are arranged to engage and securely hold edge portions of a semiconductor wafer to be processed. When the spring-mounted members are actuated toward the front side of the plate, a wafer can be freely moved into or out of the aperture from the back side of the plate by means of a vacuum chuck that contacts only the back side of the wafer. After a wafer to be held is inserted within the aperture, the actuated members are released. The released members move toward the back side of the plate and thereby engage the edges of the inserted wafer and exert radial holding forces thereon. The back side of a wafer so mounted is adapted to be brought into resilient engagement with a pedestal element in a processing chamber, thereby ensuring good thermal and electrical contact between the wafer and the pedestal element.

16 Claims, 8 Drawing Figures

FIG. 2
FIG. 3
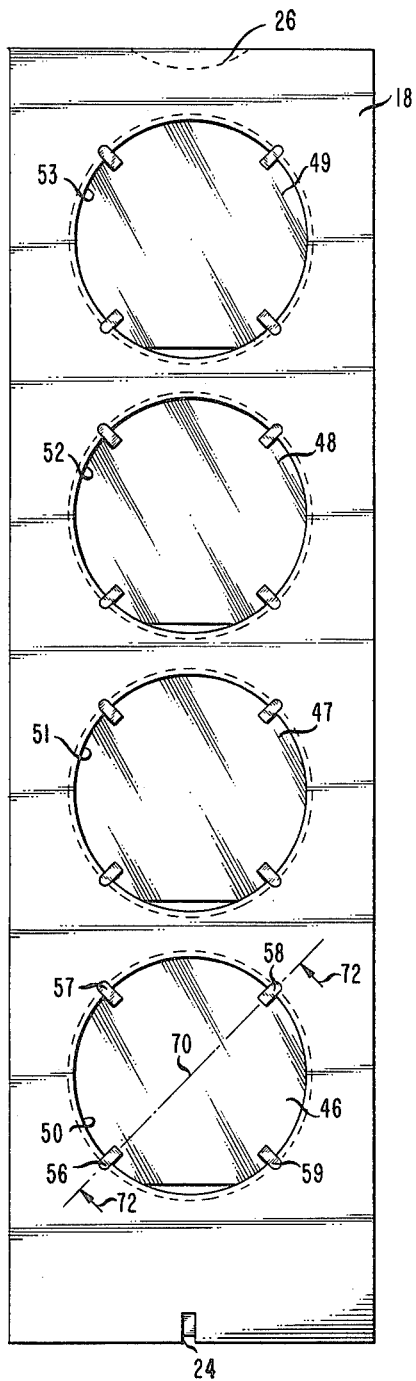
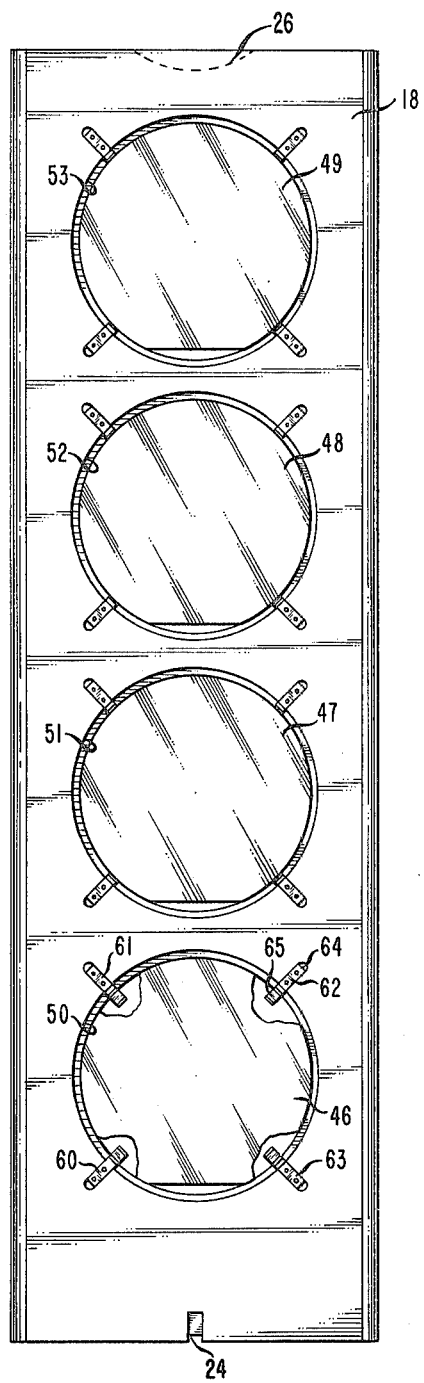

WAFER HOLDING APPARATUS AND METHOD

This application is a continuation of application Ser. No. 332,932, filed Dec. 21, 1981, now abandoned.

BACKGROUND OF THE INVENTION

The invention relates to wafer-holding techniques and, more particularly, to an apparatus and method for holding semiconductor wafers that are to be processed.

Various instrumentalities are known in the semiconductor art for holding wafers during the processing steps of a fabrication sequence. The mechanism that holds the wafers should be capable of being automatically loaded and unloaded in a simple low-contamination way. Once loaded, the mechanism should hold the wafers securely during any handling that is required to move the wafers into and out of a processing chamber. In the chamber, the wafers held in the mechanism should be capable of being maintained in good electrical and thermal contact with a base member on which the wafer-holding mechanism is to be mounted.

Considerable effort has been directed by workers in the art aimed at devising new and improved wafer-holding techniques characterized by the above and other desirable attributes. It was recognized that such efforts, if successful, could facilitate the handling of wafers, improve the processing thereof and thereby lower the cost of devices and circuits formed thereon.

SUMMARY OF THE INVENTION

Hence, an object of the present invention is to provide an improved wafer-holding technique. More specifically, an object of this invention is an improved apparatus and method for holding semiconductor wafers that are to be processed.

Briefly, these and other objects of the present invention are realized in a specific illustrative embodiment thereof that comprises a plate having at least one aperture therethrough. The aperture has substantially the same shape as but is slightly larger than a wafer to be retained within the aperture. At least three spring-mounted members are affixed to the plate and spaced apart around the periphery of the aperture. The members are designed to engage and securely hold edge portions of a wafer inserted into the aperture from the back side of the plate.

When the spring-mounted members are actuated toward the front side of the plate, a wafer can be freely moved into or out of the aperture from the back side of the plate. After a wafer is inserted within the aperture, the actuated members are released. The released members move toward the back side of the plate and thereby engage edge portions of the wafer and exert radial holding forces thereon. The back side of a wafer so mounted is adapted to be brought into resilient engagement with a pedestal element in a processing chamber, thereby ensuring good thermal and electrical contact between the wafer and the pedestal element.

BRIEF DESCRIPTION OF THE DRAWING

A complete understanding of the present invention and of the above and other features thereof may be gained from a consideration of the following detailed description presented hereinbelow in connection with the accompanying drawing, in which:

FIGS. 2 and 3 are front- and back-side depictions, respectively, of a wafer-carrying plate made in accordance with this invention;

DETAILED DESCRIPTION

The principles of the present invention are applicable to various types of wafers. Herein for purposes of a specific illustrative example, the wafers will be assumed to be standard elements made of a semiconductive material such as silicon. Moreover, it will be assumed that multiple integrated circuits are to be fabricated at multiple respective chip sites on the front side of each wafer, in a conventional manner known in the art. The wafers to be described will be assummed to be standard thin cylindrical discs each having a so-called "flat" formed along a limited edge portion of the wafer.

Wafers mounted in accordance with the principles of the present invention are well suited to be subjected to various types of processing steps included in a typical integrated circuit fabrication sequence. For purposes of a particular example, however, emphasis herein will be directed to mounting the wafers in a reactive sputter (or ion) etching system of the specific type described in U.S. Pat. No. 4,298,443. The techniques of the present invention are particularly well suited for handling wafers in such a dry etching system.

Figure 1:
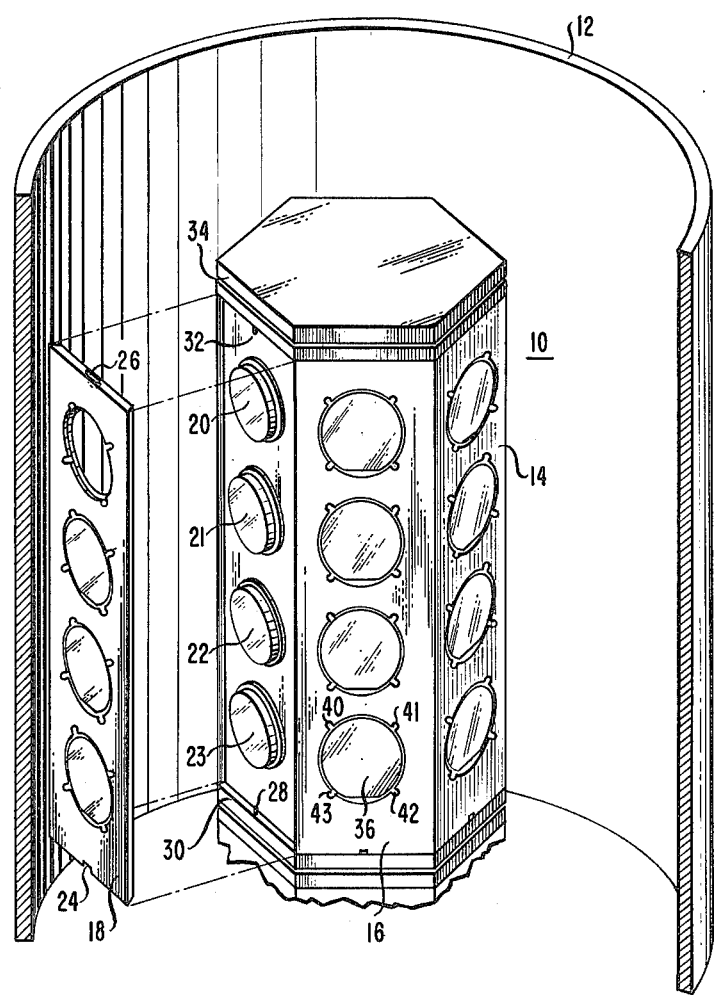
FIG. 1 is a simplified schematic representation of a portion of a specific illustrative system in which wafers to be processed are mounted in the reaction chamber of the system in accordance with the principles of the present invention.

FIG. 1 shows a multifaceted cathode element 10 and a cylindrical anode element 12 of the type disclosed in the aforecited patent. Illustratively, the element 10 includes six facets or sides on each of which four four-inch wafers to be etched are designed to be mounted. Accordingly, twenty-four wafers are able to be etched simultaneously in the specific depicted system.

In accordance with a feature of the principles of this invention, wafers to be processed in the FIG. 1 system are securely mounted in a set of six apertured plates or trays. Three such plates, designated 14, 16 and 18, are explicitly shown in FIG. 1. Each of the plates contains four wafers mounted therein in the particular manner specified in detail later hereinbelow. The plates 14 and 16 are depicted as having been already mounted on the cathode element 10, whereas the plate 18 is shown spaced apart from the element 10. Illustratively, the wafer-carrying plates are made of aluminum or magnesium suitably protected with a substantially contamination-free layer, as described in detail later below.

The planar sides of the wafers that face the anode element 12 of FIG. 1 are referred to herein as the "front" sides or faces of the wafers. It is these front sides that are to be etched in the depicted system. Further, the planar sides of the mounting plates 14, 16 and 18 that face the anode element 12 are also referred to herein as the "front" sides or faces thereof.

When the wafer-carrying plate 18 is mounted on one associated facet of the cathode element 10 (see (FIG. 1), the back sides of the wafers therein are intended to respectively contact the tops of four generally cylindrical pedestal elements 20 through 23 that constitute an integral part of the cathode element. These elements, which are, for example, made of a material such as aluminum or magnesium, are intended to be maintained in good electrical and thermal contact with the back sides of the wafers mounted thereon. As will be evident later below, such contact is assured by utilizing a wafer-mounting apparatus made in accordance with the principles of this invention.

Advantageously, the pedestal elements 20 through 23 each constitute a first relatively small-diameter cylindrical portion, a ledge portion and a second relatively large-diameter cylindrical portion. The front side of the first portion of each element is intended to contact the back side of an associated wafer. The pedestals can, for example, be formed as integral parts of the facets of the cathode element 10 or can be formed as distinct elements that are affixed to the facets by any suitable means such as screws.

To minimize contamination during etching, it is advantageous to cover the ledge portion and the curved sides of the cylindrical portions of the pedestal elements 20 through 23 of FIG. 1 with a protective layer. Suitable materials for forming the protective layer will be specified later below.

The wafer-carrying plates 14, 16 and 18 shown in FIG. 1 can be secured in place on respective facets of the cathode element 10 in various ways. In one specific embodiment, each plate has a slot formed in the lower edge thereof and a hole in the upper edge. This is illustrated in FIG. 1 wherein the plate 18 is shown as including slot 24 and hole 26. The slot 24 is designed to mate with rigid pin 28 mounted in lower base plate element 30, whereas the hole 26 is designed to have a spring-loaded pin 32 extend therein. The pin 32 is mounted on upper base plate element 34.

The internal surfaces in the reaction chamber of the FIG. 1 system are exposed to an etching plasma established between the cathode element 10 and the anode element 12. Advantageously, some or all of these surfaces are covered with a substantially contamination-free protective layer. In accordance with a feature of the principles of the present invention, the surfaces to be so covered customarily include all but the planar back side of each of the wafer-carrying plates included in the FIG. 1 system. Thus, the front sides, the edges and the aperture-defining walls of these plates are advantageously so coated. Additionally, as set forth earlier above, it is also advantageous in some processes to apply a protective layer to specified portions of the pedestal elements 20 through 23.

Various materials are particularly well suited for forming protective layers on the aforespecified wafer-carrying plates and pedestal elements, thereby to substantially reduce contamination of the wafers during the etching process. Thus, for example, if the depicted etching system is to be utilized to pattern an aluminum or polysilicon layer in a plasma derived from a mixture of boron trichloride and chlorine (or to pattern polysilicon in chlorine alone), it is advantageous to apply a plasma-spray-coated layer of aluminum oxide on the plates and pedestal elements. (The preparation and utilization of aluminum oxide layers in the reaction chamber of a plasma-assisted dry etching system is described in detail in a commonly assigned copending application of H. J. Levinstein and F. Vrathy designated Ser. No. 295,531, filed Aug. 24, 1981, now U.S. Pat. No. 4,419,201, issued Dec. 6, 1983.)

Further, if the depicted etching system is to be utilized to pattern silicon dioxide in a plasma derived from a mixture of trifluoromethane and ammonia, it is advantageous to apply a plasma-spray-coated layer of silicon on the aforedescribed parts of the etching apparatus. (The preparation and utilization of silicon layers in the reaction chamber of a plasma-assisted dry etching system is described in detail in a commonly assigned copending application of H. J. Levinstein and F. Vrathy designated Ser. No. 295,650, filed Aug. 24, 1981, now abandoned and replaced by a continuation application designated Ser. No. 471,901, filed Mar. 4, 1983.)

Additionally, certain polymers (specified below) are suitable for forming general-purpose low-contamination protective layers in the reaction chamber of a plasma-assisted etching system. Hence, for patterning, for example, aluminum, polysilicon, silicon dioxide, a variety of resist materials, silicon nitride, phosphosilicate glass, boron nitride, single-crystal silicon, tantalum, tungsten and tantalum disilicide layers, it is advantageous to cover the aforespecified surfaces in the reaction chamber with a layer of a polyacrylate polymer such as Ardel (more specifically, Ardel 100, 1 Ardel 203, Ardel 205 or Ardel 208).

Ardel is made by and available in pellet form from Union Carbide, Bound Brook, N.J. In turn, the Ardel polymer pellets are processed by a number of commercial fabricators who convert the pellet-form material into strips, ribbons, bars, plates or sheets. One source of converted Ardel, for example in the form of one-eighth-inch-thick sheets, is Westlake Plastics, Lenni, Pa. Illustratively, such sheets can be applied to the wafer-carrying plates by screwing, riveting or adhesive bonding.

Additional details concerning Ardel, as well as a list of other polyacrylate polymers suitable for inclusion in the herein-specified reaction chamber, are contained in a commonly assigned copending application of J. M. Moran designated Ser. No. 295,839, filed Aug. 24, 1981.

In FIG. 1, each of the wafers retained in the depicted plates is shown as being held therein by four members whose exact function and structure will be specified in detail later below. Thus, for example, the wafer 36 in the bottom aperture of the plate 16 is indicated as being held in place by four members 40 through 43.

In accordance with the principles of the present invention, only three wafer-retaining members are in fact necessary for mounting each wafer in its associated aperture in a true and secure manner. Nevertheless, applicants have found that it is generally advantageous in practive to utilize four such members per wafer. This provides a particularly rugged and dependable supporting arrangement for use in a production environment. Accordingly, while recognizing that in principle only three members are adequate for some applications of practical interest, the main emphasis herein will be directed towards the utilization of four members per wafer.

Front and back views of one of the aforementioned wafer-carrying plates are shown in FIGS. 2 and 3, respectively. In particular, the plate 18 is shown therein. Four wafers 46 through 49 are shown respectively mounted within four apertures or through-holes 50 through 53 formed in the plate 18. As indicated in the drawing, each such aperture has substantially the same shape as but is slightly larger than the wafer to be mounted therein.

As shown in FIGS. 2 and 3, wafer-supporting members are mounted on the plate 18 around the periphery of each of the apertures 50 through 53. Illustratively, each aperture is shown as having four such members disposed therearound.

Thus, for example, the bottom aperture 50 in the plate 18 (FIG. 2) has four wafer-supporting members approximately equally spaced around the periphery of the aperture. Each such member includes a retaining element affixed to a leaf spring element. The retaining elements associated with the aperture 50 are designated 56 through 59 (FIG. 2), whereas the spring elements associated therewith are designated 60 through 63 (FIG. 3). Each spring element is securely affixed near one end thereof to the plate 18 and near the other or free end thereof to its associated retaining element. By way of example, the spring element 62 is shown secured to its associated retaining element 57 by a screw 65 (FIG. 3). Illustratively, the hole formed near the free end of each spring element is oversized or slotted thereby to allow the associated retaining element to be radially adjusted before being securely screwed to its spring element. The hole formed near the other end of each spring element may also be oversized or slotted thereby to allow for additional adjustment of the wafer-supporting members.

As indicated in FIGS. 2 and 3, the wafer-supporting members around each aperture are nested in slots formed in the front and back sides of the plate 18. The slots are slightly wider than the spring-loaded movable members respectively positioned therein.

Figure 4:
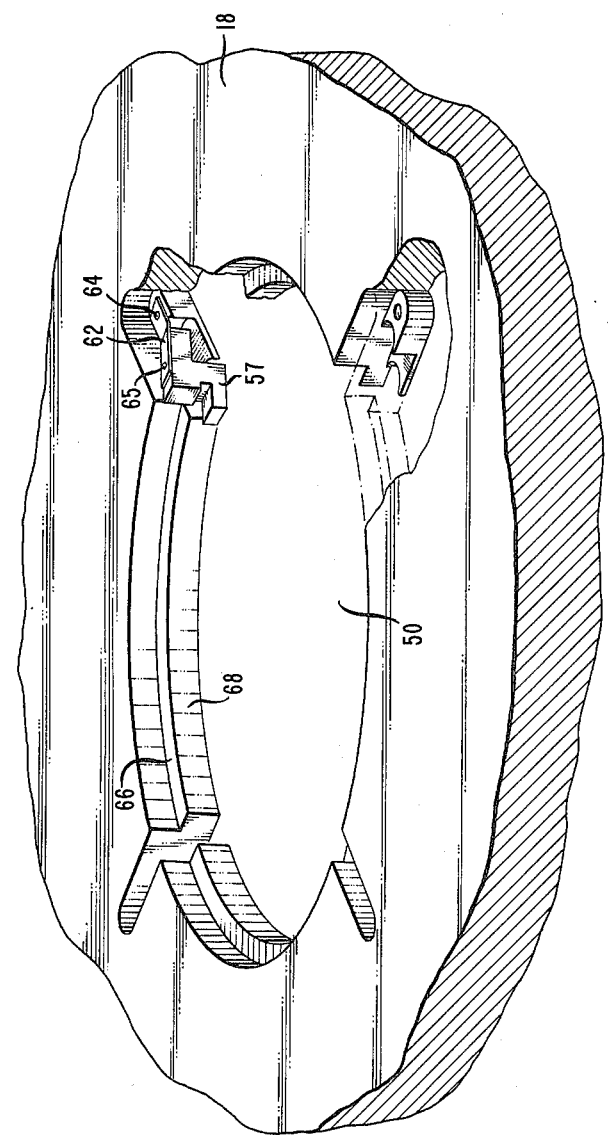
FIG. 4 is a partially broken-away perspective view of a part of the back side of the plate shown in FIGS. 2 and 3.

FIG. 4 is a view of a partially assembled portion of the back side of the structure shown in FIG. 3. The depicted portion includes the bottom aperture 50 in the plate 18, without a wafer mounted therein. Additionally, only one of the aforedescribed wafer-supporting members associated with the aperture is explicity shown in FIG. 4. In that way, the detailed configuration of the aperture and slots defined in the plate 18 is apparent.

In its quiescent condition (i.e., without a wafer in contact therewith) the single wafer-supporting member of FIG. 4 is oriented as shown. The depicted member comprises the retaining element 57 and its associated spring element 62. One end of the element 62 is fixedly secured to a ledge portion of the plate 18 by the screw 64. The other or movable end of the element 62 is attached to the retaining element 57 by the screw 65.

In accordance with a feature of the principles of the present invention, the retaining elements such as the element 57 shown in FIG. 4 are advantageously machined, molded or otherwise formed from a rugged, dimensionally stable, low-contamination material such as the aforespecified Ardel polymer. Further the spring elements such as the leaf spring element 62 shown in FIG. 4 are advantageously made of spring stainless steel.

In accordance with another feature of this invention, each aperture contained in the herein-considered wafer-carrying plates or trays includes a ledge portion such as the portion 66 shown in FIG. 4. The ledge portion 66 is designed to be contacted by the aforedescribed ledge portion of an associated one of the pedestal elements 20 through 23 when the back side of the plate 18 is mounted in contact with the planar surface portion of one of the facets of the cathode element 10 (FIG. 1). In that way, even though a gap invariably exists between the periphery of a mounted wafer and the curved surface 68 (FIG. 4), the etching plasma overlying the front side of the plate 18 does not directly "see" any unprotected portions of the associated pedestal element or planar facet surface. All such portions are advantageously protected with one of the low-contamination materials specified earlier above.

Figure 5:
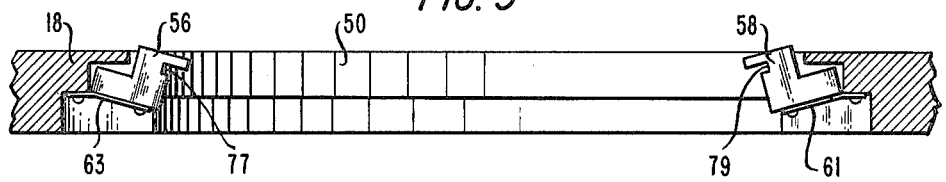
FIGS. 5 through 7 are cross-sectional views of a portion of the aforementioned plate.

Another view of the wafer-supporting members in their quiescent or unloaded condition is shown in FIG. 5. FIG. 5 constitutes a cross-sectional view at reference line 70 of FIG. 2 in the direction of arrows 72.

A wafer to be inserted into the aperture 50 of FIG. 5 is introduced therein from the bottom (or back) side of the depicted assembly. Once mounted in the assembly, a wafer is securely held therein. Hence, the plate 18 with multiple wafers mounted in place constitutes a convenient carrier for the wafers. Illustratively, the wafers are mounted or loaded into (and later unloaded from) the plate 18 at an automatic loading and unloading station associated with the herein-described etching system. After being loaded, the plate 18 is carried (manually or automatically) to the reaction chamber of the system for mounting on one of the facets of the cathode element 10 (FIG. 1).

Figure 6:
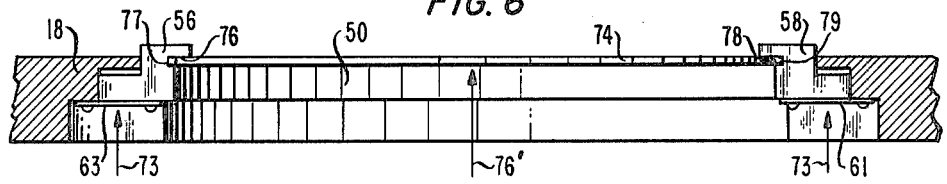

The step of loading a wafer into an aperture in one of the aforespecified wafer-carrying plates is schematically illustrated in FIG. 6. Initially, it is customary to actuate the wafer-supporting members toward the front or upper face of the plate 18 shown in FIG. 6. This is done, for example, by exerting upward forces near the free ends of the spring elements with a straightforward four-pronged tool (one prong for each of the four spring elements mounted around the aperture 50) or with an aperture circular tool that engages the spring elements while providing an opening through which a wafer can be inserted. These forces are indicated in FIG. 6 by arrows 73. As a result, the spring elements 61, 63 and their respective affixed retaining elements 58, 56 are moved to the positions indicated in FIG. 6.

Figure 7:
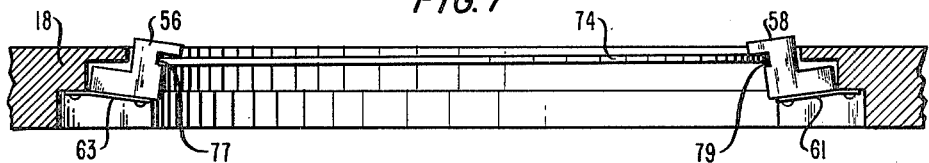

With the retaining elements 56, 58 positioned as shown in FIG. 6, a wafer 74 can be freely inserted into the aperture 50 in the direction of arrow 76' from the back side of the plate 18. Illustratively, insertion is accomplished by means of a standard vacuum chuck (not shown) that holds the wafer 74 by contacting only the back side thereof. The inserted wafer is moved into contact with lower lip portions 76, 78 of the retaining elements 56, 58, respectively. Thereafter, the spring elements 61, 63 are released and the vacuum chuck is removed from the back side of the wafer 74. As a result, the free ends of the spring elements 61, 63 move downward and in so doing carry their respective attached retaining elements 58, 56 into secure engagement with edge portions of the wafer 74, as indicated in FIG. 7. The radially directed forces exerted by the retaining elements on the edges of the wafer 74 are effective to securely hold the wafer in its depicted position. As so held, the wafers in the plate 18 can, for example, be conveniently transported from a loading station in the reaction chamber of the etching system represented in FIG. 1.

After being processed (or whenever desired for whatever reason), a wafer held in one of the aforespecified plates is easily removable therefrom. This is done by again moving the associated spring elements towards the front side of the plate while engaging the back side of the wafer with a standard vacuum chuck. In that way, the wafer can be easily removed from its mounted position via the back side of the plate.

During both loading into and unloading from the aforespecified plate members, only the back side of each wafer is contacted, as described herein. This is advantageous in that the likelihood of damaging or contaminating the front sides of the wafers is thereby substantially reduced.

As mounted in the plate 18, both sides of the wafer 74 are accessible. This is a practical advantage of the herein-considered wafer-holding technique. The top side of the wafer of course remains accessible for processing after the plate 18 is mounted in a processing chamber. Moreover, both before and after processing, the back side of the mounted wafer remains easily accessible. Thus, for example, identification marks on the back side of the wafer may be readily observed during handling or storage. Or damage-site gettering on the back side of the wafer may be conveniently carried out while the wafer is still held in the plate 18.

Advantageously, but not necessarily, the aforedescribed retaining elements include slots formed therein (see, for example, slots 77, 79 in FIGS. 5, 6 and 7). When the retaining elements are released, these slots serve to engage and hold edge portions of the wafer 74 in a particularly secure mechanical manner. A wafer so mounted can be handled with an especially high degree of confidence that it will not become dislodged from the plate 18.

When the wafer 74 is mounted in the plate 18 in the manner indicated in FIG. 7, the top surface of the wafer is typically slightly recessed with respect to the top planar surface of the plate 18. Subsequently, when the plate 18 is mounted on a facet of the cathode element 10 (FIG. 1), it is desirable that the top surface of the wafer 74 and of the other wafers to be etched be established in the same plane as the top surface of the plate 18. The manner in which this occurs is specified below.

Figure 8:
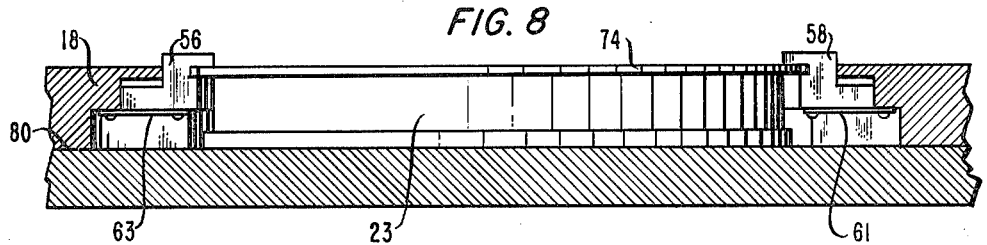
FIG. 8 is a cross-sectional view of a portion of the plate showing a wafer maintained thereby in contact with a pedestal element.

In FIG. 8, the back side of the plate 18 is shown mounted in place on a planar facet 80 of the cathode element 10 (FIG. 1). When the plate is so mounted, the back side of the wafer 74 is forced slightly upwards by the top of the pedestal element 23. Consequently, the back side of the wafer is maintained in intimate and firm resilient engagement with the cathode element. Further, the design of the depicted assembly is such that the front surface of the mounted wafer is in the plane of the front surface of the plate 18. This tends to ensure that the electric field and hence the etching across the mounted wafers will be highly uniform.

Advantageously, the longitudinal edges of the herein-described wafer-mounting plates included in the processing system represented in FIG. 1 are designed to overlap when the plates are positioned in place on the cathode electrode 10. This tends to ensure that the etching plasma does not directly "see" any unprotected portions of the planar facets of the cathode element.

Finally, it is to be understood that the above-described wafer-mounting techniques are only illustrative of the principles of the present invention. In accordance with these principles, numerous modifications and alternatives may be devised by those skilled in the art without departing from the spirit and scope of the invention.

What is claimed is:

1. In combination,
    a plate member having a planar front side and at least one through aperture that is adapted to have a wafer mounted therein,
    means including at least three spring-mounted retaining elements affixed to said plate member around the periphery of each aperture for applying radially directed holding forces to edge portions of a wafer introduced into the aperture from the back side of the plate member,
    each of said retaining elements having a leaf spring element associated therewith, one end of each leaf spring element being fixedly secured to said plate member and the other or free end of each leaf spring element being fixedly secured to its associated retaining element,
    each of said retaining elements including a planar wafer-front-side-engaging portion and a planar wafer-edge-side-engaging portion, the planes of said portions being approximately orthogonally disposed with respect to each other and the planes of said portions forming respective facing adjacent angles with the plane of the back side of said plate member, which angles, before a wafer is introduced into said aperture, are each less than 90 degrees,
    each aperture in said plate member beidng adapted to have a wafer mounted therein, each wafer being held in its respective aperture by the retaining elements associated therewith in a resilient manner to maintain the planar front side of each wafer slightly depressed within the aperture with respect to the planar front side of said plate member,
    and further including means in the reaction chamber of a processing system for mounting said plate member, said mounting means including a planar mounting surface having thereon as many pedestal elements as there are wafers in the plate member, said elements being positioned in registry with said mounted wafers when said plate member is mounted in place in said chamber, such that the back side of said mounted plate member rests on said planar mounting surface and the tops of said pedestal elements are resiliently maintained in thermal and electrical contact major portions of the respective back sides of the mounted wafers, and such that the planar front sides of said wafers are thereby established in the same plane as the front side of said plate member.

2. A combination as in claim 1 wherein said mounting means comprises the centrally positioned hexagonal cathode electrode of a reactive sputter etching system in which an etching plasma is to be established in said chamber, said cathode electrode including six of the aforespecified mounting surfaces on which are respectively mounted six of the aforespecified wafer-carrying plate members.

3. A combination as in claim 2 wherein some of the surfaces in said reaction chamber including at least the planar front sides of said plate members constitute surfaces that generate relatively low levels of contamination during the plasma etching process.

4. A combination as in claim 3 wherein said surfaces constitute a layer of aluminum oxide.

5. A combination as in claim 4 wherein said surfaces constitute a layer of silicon.

6. A combination as in claim 4 wherein said surfaces constitute a layer of a polyarylate polymer.

7. A method of simultaneously processing multiple wafers in a reaction chamber that includes a multifaceted electrode, each of said facets having plural spaced-apart pedestals, said method comprising the steps of
    mounting plural wafers in each of a number of apertured plates by inserting the wafers into the respective apertures from the back sides of the plates to bring edge portions of each wafer into resilient engagement with spring-mounted retaining elements affixed to the plates around the periphery of each of the apertures, the front surface of each such mounted wafer being recessed within its respective aperture, and mounting the wafer-carrying plates on the respective facets of said electrode to maintain the back surfaces of the wafers in respective contact with the top surfaces of the pedestals and to thereby establish the front surface of each wafer in the same plane as the front side of its associated plate.

8. Processing apparatus comprising a reaction chamber, an electrode within said chamber, said electrode having at least one pedestal member, a wafer-retaining assembly comprising a plate having at least one wafer-receiving aperture therethrough, said assembly including means mounted on said plate and disposed around the periphery of each aperture for resiliently engaging and securely holding a wafer within the aperture independent of whether or not said assembly is mounted on said electrode, and means for mounting said assembly on said electrode to establish a major portion of the back surface of each wafer held within an aperture of said plate in resilient engagement with the top surface of a respective aligned pedestal member.

9. Apparatus as in claim 8 wherein said plate is mounted on said electrode to establish the front surface of each wafer therein in the same plane as that of the front surface of said plate.

10. Apparatus as in claim 9 wherein said electrode constitutes a multifaceted electrode each facet of which includes plural spaced-apart pedestal members, and wherein a separate mounting plate having plural wafer-receiving apertures respectively aligned with the pedestal members is mounted on each facet of said electrode.

11. Apparatus as in claim 10 wherein said electrode constitutes the cathode electrode of a reactive sputter etching apparatus.

12. Processing apparatus comprising a reaction chamber, an electrode within said chamber, said electrode having at least one pedestal member, and means for mounting a wafer to be processed on said electrode, said mounting means comprising a plate having at least one water-receiving aperture therethrough and elements mounted on said plate and disposed around the periphery of each aperture for resiliently engaging and securely holding a wafer within the aperture independent of whether or not said plate is positioned on the electrode in said reaction chamber, whereby when the plate is positioned on said electrode with the aperture(s) in respective alignment with the pedestal member(s), the back surface of each wafer held within an aperture of said plate is established in resilient engagement with the top surface of an aligned pedestal member.

13. Apparatus as in claim 12 wherein some of the surfaces in said reaction chamber including at least the planar front side of said plate constitute surfaces that generate relatively low levels of contamination when a wafer is processed.

14. Apparatus as in claim 13 wherein said surfaces are coated with a layer of aluminum oxide.

15. Apparatus as in claim 13 wherein said surfaces are coated with a layer of silicon.

16. Apparatus as in claim 13 wherein said surfaces are coated with a layer of a polyarylate polymer.

* * * * *

UNITED STATES PATENT AND TRADEMARK OFFICE
CERTIFICATE OF CORRECTION

PATENT NO.   : 4,473,455
DATED        : September 25, 1984
INVENTOR(S)  : Robert E. Dean, et al.

It is certified that error appears in the above-identified patent and that said Letters Patent is hereby corrected as shown below:

Column 4, line 22, "polyacrylate" should read
--polyarylate--, line 35, "polyacrylate" should read
--polyarylate--, Column 8, line 38, insert "with" before "major portion of", Column 10, line 12, "water" should read --wafer--.

Signed and Sealed this

Twenty-third Day of July 1985

[SEAL]

Attest:

DONALD J. QUIGG

Attesting Officer    Acting Commissioner of Patents and Trademarks